United States Patent
Lee

(10) Patent No.: US 6,524,886 B2
(45) Date of Patent: Feb. 25, 2003

(54) METHOD OF MAKING LEADLESS SEMICONDUCTOR PACKAGE

(75) Inventor: Shih Chang Lee, Kaohsiung (TW)

(73) Assignee: Advanced Semiconductor Engineering Inc. (TW)

( * ) Notice: Subject to any disclaimer, the term of this patent is extended or adjusted under 35 U.S.C. 154(b) by 0 days.

(21) Appl. No.: 09/863,323

(22) Filed: May 24, 2001

(65) Prior Publication Data

US 2002/0177256 A1 Nov. 28, 2002

(51) Int. Cl.⁷ .................. H01L 21/00; H01L 21/44; H01L 21/48; H01L 21/50
(52) U.S. Cl. .............. 438/106; 438/112; 438/124; 257/678
(58) Field of Search ................. 438/107, 106, 438/111, 112, 122, 124, 964; 257/678, 732, 733

(56) References Cited

U.S. PATENT DOCUMENTS

| | | | |
|---|---|---|---|
| 5,172,214 A | | 12/1992 | Castro ................ 257/676 |
| 5,286,999 A | * | 2/1994 | Chiu ................... 257/666 |
| 5,894,108 A | | 4/1999 | Mostafazadeh et al. .... 174/52.4 |
| 6,372,539 B1 | * | 4/2002 | Bayan et al. ............ 438/106 |
| 6,542,255 | * | 9/2002 | Bayan et al. ............ 257/666 |

* cited by examiner

*Primary Examiner*—William David Coleman

(57) ABSTRACT

A method of making a leadless semiconductor package mainly comprising the steps of: attaching a tape onto the bottom of a lead frame; attaching a semiconductor chip to the die pad of the lead frame and electrically coupling the semiconductor chip to the leads of the lead frame; forming a package body over the semiconductor chip and the lead frame in a manner that each lead of the lead frame has at least a portion exposed from the bottom of the package body; removing the tape; and grinding the bottom of the package body as well as the exposed portions of the lead frame till each lead of the lead frame is less than about 1 mil thick thereby reducing the problems due to CTE mismatch between the leads and the package body.

12 Claims, 2 Drawing Sheets

METHOD OF MAKING LEADLESS SEMICONDUCTOR PACKAGE

BACKGROUND OF THE INVENTION

1. Field of the Invention

This invention is related to a lead frame package, and more specifically to a method of making a leadless semiconductor package.

2. Description of the Related Art

Lead frame packages have been used for a long period of time in the IC packaging industry mainly because of their low manufacturing cost and high reliability. However, as integrated circuits products move its endless pace toward both a faster speed and a smaller size, the traditional lead frame packages have become gradually obsolete for some high performance-required packages. Thus BGA (Ball Grid Array Packages) and CSP (Chip Scale Package) have emerged and become increasingly popular as a new packaging choice. The former has been widely used in IC chips that have higher I/Os and need better electrical and thermal performance than the conventional packages such as CPU and graphic chips. The latter has been widely used in mobile products of which the footprint, package profile and package weight are major concerns.

However, the lead frame package still remains its market share as a cost-effective solution for low I/O ICs. Traditional lead frame package has its limit of providing a solution for chip scale and low profile package due to the long inner leads and outer leads. Therefore, the semiconductor packaging industry develops a leadless package without outer leads such that both the foot print and the package profile can be greatly reduced. FIG. 1 shows a bottom view of a leadless package 100 wherein the leads 110a are disposed at the bottom of the package as compared to the conventional gull-wing or J-leaded type package. The die pad 110b of the leadless package 100 is exposed from the bottom of the package thereby providing better power dissipation. Typically, there are four tie bars 110c being connected to the die pad 110b.

Due to the elimination of the outer leads, the leadless package 100 is featured by lower profile and light weight. Furthermore, due to the lead length reduction, the corresponding reduction in the resistance, conductance and capacitance make the leadless package 100 very suitable for RF (radio-frequency) product packages operating in several GHz to tens of GHz frequency range. It's also a cost-effective package due to its use of existing BOM (bill of materials). All the above-mentioned properties make the current leadless packages very suitable for telecommunication products such as cellular phones, portable products such as PDA (personal digital assistant), digital cameras, and IA (Information Appliance).

The typical method for producing a leadless semiconductor chip package comprises the steps of: (A) attaching a semiconductor chip 120 onto the die pad 110b of a lead frame, wherein the lead frame comprises a plurality of leads 110a arranged about the periphery of the die pad 110b; (B) wire-bonding the leads of the lead frame to bonding pads on the semiconductor chip; and (C) forming a package body 130 over the semiconductor chip and the lead frame in a manner that each lead of the lead frame has at least a portion exposed from the bottom of the package body.

Typically, the package body 130 is formed from molding compound with a coefficient of thermal expansion (CTE) of 8 ppm/° C.(Alpha 1)–32 ppm/° C.(Alpha 2). However, the lead frame (i.e., the leads) is usually made of copper with a coefficient of thermal expansion (CTE) of 18 ppm/° C. and has a thickness of about 5 mils. The package body 130 and the leads 110a have a significant difference in CTE and the leads 110a are rather thick. Thus the package body 130 and the leads 110a expand and contract in different amounts along with temperature fluctuations during the curing process of the package body 130, which often causes the leadless package 100 to fail the environment stress test.

To reduce the problems described above, the thickness of the lead frame may be reduced down to about 1 mil. However, during the whole packaging process, if the lead frame is reduced too much in thickness, it will be unable to provide sufficient strength for supporting the semiconductor chip.

SUMMARY OF THE INVENTION

It is therefore an object of the present invention to provide a method of making a leadless semiconductor package which overcomes or at least reduces the problems and disadvantages associated with the above-described technique.

The method of making a leadless semiconductor package in accordance with the present invention comprising: (a) providing a lead frame including a die pad and a plurality of leads; (b) attaching a semiconductor chip to the die pad of the lead frame and electrically coupling the semiconductor chip to the leads of the lead frame; (c) forming a package body over the semiconductor chip and the lead frame in a manner that each lead of the lead frame has at least a portion exposed from the bottom of the package body; and (d) grinding the bottom of the package body as well as the exposed portions of the lead frame. Preferably, a tape is attached onto the bottom of the lead frame before proceeding to the step (b) for avoiding the mold flash problem in the molding process, and the tape is removed after completing the step (c).

It is noted that the grinding step proceeds till each lead of the lead frame is less than about 1 mil thick thereby reducing the problems due to CTE mismatch between the leads and the package body.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
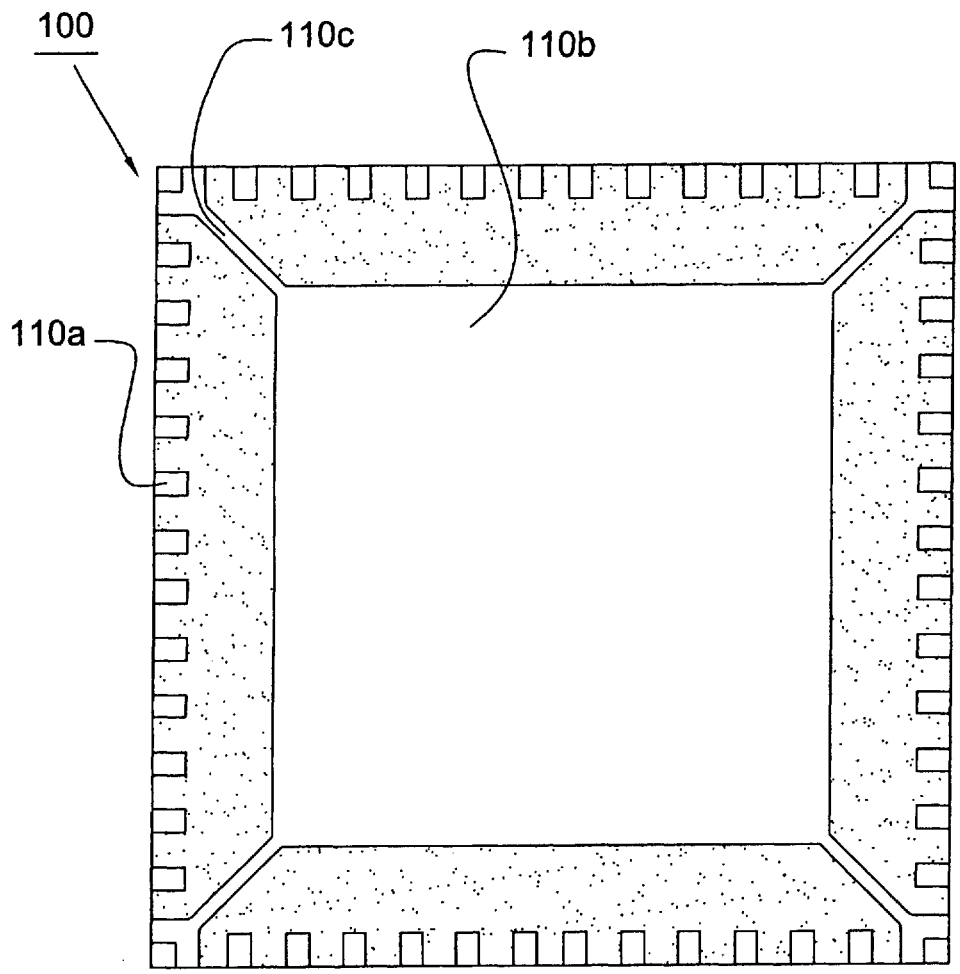
FIG. 1 is a bottom view of a conventional leadless package.
Figure 2:
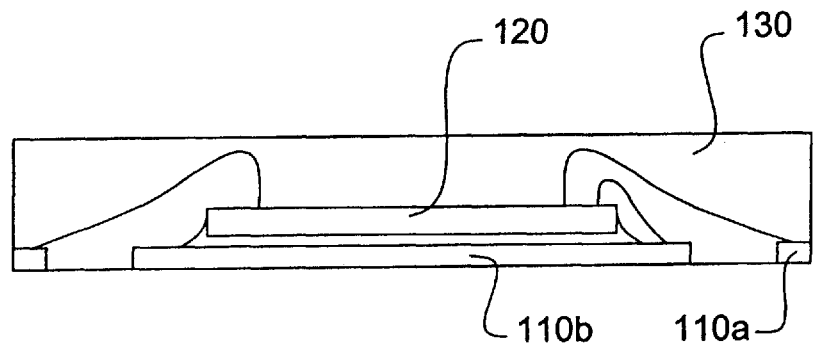
FIG. 2 is a cross sectional view of the conventional leadless package of FIG. 1.
Figure 3:
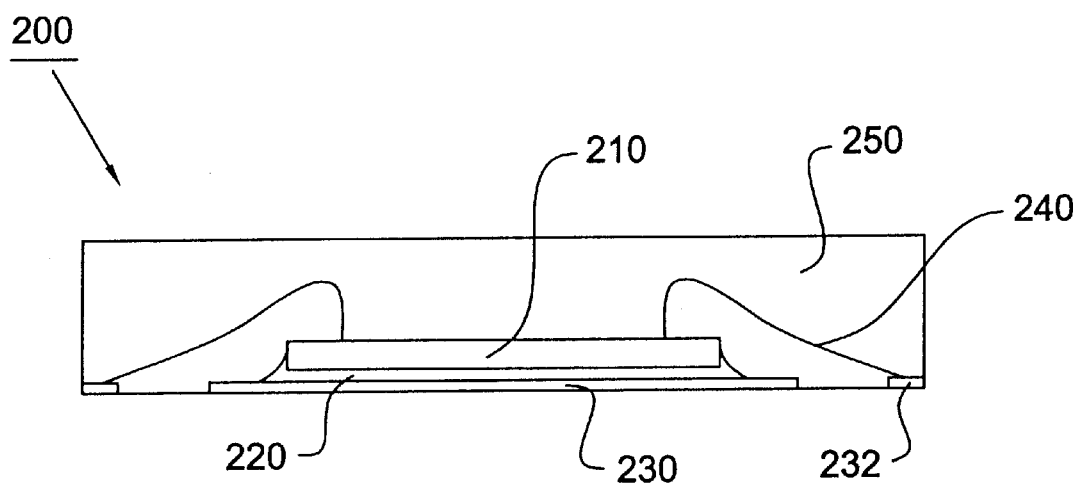
FIG. 3 is a cross sectional view of a leadless semiconductor package according to a preferred embodiment of the present invention.

FIG. 3 shows a leadless semiconductor package 200 in accordance with a preferred embodiment of the present invention. The package 200 comprises a chip 210 attached to a die pad 230 by an adhesive such as silver paste 220. The active surface of the chip 210 is provided with a plurality of bonding pads (not shown) electrically connected to leads 232 through a plurality of bonding wires such as gold wires 240. The leads 232 are arranged at the periphery of the die pad 330. The semiconductor chip 210, the gold wires 240 and the leads 232 are encapsulated in a package body 250 in a manner that the bottom surface of each lead 232 has at least a portion exposed from the bottom of the package body 250 for making external electrical connection. Preferably, the backside surface of the die pad 230 is exposed from the bottom of the package body 250 thereby enhancing the thermal performance of the package 200. Usually, there are four tie bars (not shown) being connected to the die pad 230. Each tie bar extends from a corner of the die pad 230 to a corresponding corner of the package 200. According to the present invention, the leadless semiconductor package 200 is characterized in that the thickness of the die pad 230 and each lead 232 is reduced down to about 1 mil.

The method for producing a leadless semiconductor chip package in accordance with the present invention is described below.

Firstly, a tape is attached onto the bottom of the lead frame for avoiding the mold flash problem in the molding process. Preferably, the tape is made of heat-resistant and elastic material such as polyimide, Teflon (polytetrafluoroethylene, PTFE) or ETFE (ethylene tetrafluoroethylene). Typically, the lead frame in accordance with the present invention is formed from a thin metal strip. Preferably, the thin metal strip is made of copper or alloys containing copper. Alternatively, the thin metal strip may be made of iron, nickel or alloys thereof, and then plated with copper. In mass production, it is desirable to integrally form a plurality of units in a lead frame having alignment holes so that the packaging process (including molding process) can be automated. Each unit includes a plurality of leads arranged at the periphery of a die pad connected to the lead frame by four tie bars.

Then, a semiconductor chip 320 is securely attached onto the die pad 230 of the lead frame by an adhesive such as silver paste 220, and the silver paste is cured after die attach. After that, a plurality of bonding wires such as gold wires 240 are respectively connected to the leads 232 of the lead frame and the corresponding bonding pads of the semiconductor chip 210 using a regular wire-bonding process.

After wire bonding, the lead frame and the chips attached thereon are encapsulated in a package body 250. Typically, a MAP (mold array package) molding process was used to accomplish this encapsulation. After the molding process, the tape is removed from the molded product. It is noted that, each lead of the lead frame has at least a portion exposed from the bottom of the package body 250 when the tape is removed.

The molded product is then ground using a conventional polishing technique such as Chemical Mechanical Polishing to reduce the thickness thereof. Specifically, the bottom of the package body 250 including the exposed portions of the lead frame are ground until each lead of the lead frame is less than about 1 mil thick.

Finally, a singulation step is conducted to complete the packaging process. In the singulation process, a resin-bond saw blade is used to cut the molded product into separate units along predetermined dicing lines to obtain the finished leadless semiconductor packages.

The leadless semiconductor package can be mounted onto a substrate, such as a printed circuit board (PC board), like other leadless devices. For example, a PC board is screen printed with a solder paste in a pattern which corresponds to the pattern of the leads 232 exposed from the bottom of the package 200. The package 300 is then appropriately positioned on the PC board and the solder is reflowed by using the conventional surface mount technology. Alternatively, the leads 232 exposed from the bottom of the package 200 can be printed with solder paste and then mounted onto the PC board.

In the leadless package of the present invention, each lead of the lead frame is reduced down to about 1 mil thereby reducing the problems due to CTE mismatch between the leads and the package body.

Although the invention has been explained in relation to its preferred embodiment, it is to be understood that many other possible modifications and variations can be made without departing from the spirit and scope of the invention as hereinafter claimed.

What is claimed is:

1. A method of making a leadless semiconductor package, said method comprising the steps of:
    providing a lead frame including a die pad and a plurality of leads;
    attaching a semiconductor chip to the die pad of the lead frame;
    electrically coupling the semiconductor chip to the leads of the lead frame;
    forming a package body over the semiconductor chip and the lead frame in a manner that each lead of the lead frame has at least a portion exposed from the bottom of the package body; and
    grinding the bottom of the package body as well as the exposed portions of the lead frame till the entire lead frame is less than about 1 mil in thickness.

2. The method as claimed in claim 1, wherein the grinding step is accomplished by a Chemical Mechanical Polishing technique.

3. The method as claimed in claim 1, wherein the backside surface of the die pad is exposed from the bottom of the package body.

4. The method as claimed in claim 1, further comprising the step of attaching a tape onto the lead frame before the chip attaching step, and the step of removing the tape after forming the package body.

5. The method as claimed in claim 4, wherein the grinding step is accomplished by a Chemical Mechanical Polishing technique.

6. The method as claimed in claim 4, wherein the backside surface of the die pad is exposed from the bottom surface of the package.

7. A method of making a leadless semiconductor package, said method comprising the steps of:
    providing a lead frame including a die pad and a plurality of leads;
    attaching a semiconductor chip to the die pad of the lead frame;
    electrically coupling the semiconductor chip to the leads of the lead frame;
    forming a package body over the semiconductor chip and the lead frame in a manner that each lead of the lead frame has at least a portion exposed from the bottom of the package body; and
    grinding the bottom of the package body as well as the exposed portions of the lead frame till each said lead, in its entirety, is less than about 1 mil in thickness.

8. The method as claimed in claim 7, wherein the grinding step is accomplished by a Chemical Mechanical Polishing technique.

9. The method as claimed in claim 7, wherein the backside surface of the die pad is exposed from the bottom of the package body.

10. The method as claimed in claim 7, further comprising the steps of attaching a tape onto the lead frame before the chip attaching step, and removing the tape after forming the package body.

11. The method as claimed in claim 10, wherein the grinding step is accomplished by a Chemical Mechanical Polishing technique.

12. The method as claimed in claim 10, wherein the backside surface of the die pad is exposed from the bottom surface of the package.

* * * * *